(12) United States Patent
Theuss et al.

(10) Patent No.: US 7,775,115 B2
(45) Date of Patent: Aug. 17, 2010

(54) SENSOR COMPONENT AND METHOD FOR PRODUCING A SENSOR COMPONENT

(75) Inventors: Horst Theuss, Wenzenbach (DE); Thomas Herndl, Biedermannsdorf (AT); Werner Weber, Munich (DE); Joachim Weitzel, Markt Indersdorf (DE); Albert Auburger, Regenstauf (DE)

(73) Assignee: Infineon Technologies AG, Munich (DE)

( * ) Notice: Subject to any disclaimer, the term of this patent is extended or adjusted under 35 U.S.C. 154(b) by 610 days.

(21) Appl. No.: 11/692,592

(22) Filed: Mar. 28, 2007

(65) Prior Publication Data

US 2008/0227235 A1    Sep. 18, 2008

(30) Foreign Application Priority Data

Mar. 14, 2007    (DE)    .................. 10 2007 012 335

(51) Int. Cl.
G01L 9/00    (2006.01)
(52) U.S. Cl. .......................................... 73/705; 73/753
(58) Field of Classification Search ....................... None
See application file for complete search history.

(56) References Cited

U.S. PATENT DOCUMENTS

| | | | | |
|---|---|---|---|---|
| 6,161,962 A * | 12/2000 | French et al. | ............ | 384/459 |
| 6,625,029 B2 * | 9/2003 | Bernini | ............ | 361/728 |
| 6,919,221 B2 | 7/2005 | Linke | | |
| 7,444,877 B2 * | 11/2008 | Li et al. | ............ | 73/651 |
| 2003/0011276 A1 | 1/2003 | Nowottnick | | |
| 2004/0016989 A1 | 1/2004 | Ma et al. | | |
| 2004/0150499 A1 | 8/2004 | Kandler | | |
| 2005/0104149 A1 | 5/2005 | Bauer et al. | | |
| 2005/0163063 A1 | 7/2005 | Kuchler et al. | | |
| 2006/0273420 A1 | 12/2006 | Bauer et al. | | |
| 2006/0288789 A1 | 12/2006 | Ullmann | | |
| 2007/0216595 A1 * | 9/2007 | Hashiyama et al. | ......... | 343/848 |

FOREIGN PATENT DOCUMENTS

| | | |
|---|---|---|
| DE | 29617096 | 2/1997 |
| DE | 19757006 | 1/1999 |
| DE | 19903049 | 8/2000 |
| DE | 19934248 | 2/2001 |
| DE | 20211518 | 10/2002 |
| DE | 20218044 | 4/2003 |
| DE | 10240446 | 3/2004 |
| DE | 10346474 | 5/2005 |

(Continued)

OTHER PUBLICATIONS

English Translation of Claim 1 of DE29617096, Pub. date: Jan. 9, 1997.

(Continued)

Primary Examiner—Lisa M Caputo
Assistant Examiner—Jermaine Jenkins
(74) Attorney, Agent, or Firm—Banner & Witcoff, Ltd.

(57) ABSTRACT

A device for detecting a measured quantity has a sensor chip for detecting the measured quantity, a supply for providing a power supply, and an injection-molded enclosure for accommodating the sensor chip and the supply, the injection-molded enclosure including integrated conductive traces providing an electrical connection between the sensor chip and the supply.

35 Claims, 2 Drawing Sheets

FOREIGN PATENT DOCUMENTS

| | | |
|---|---|---|
| DE | 10348980 | 6/2005 |
| DE | 102004004292 | 9/2005 |
| DE | 202005017626 | 2/2006 |
| DE | 202005017627 | 2/2006 |
| DE | 102005025754 | 12/2006 |
| DE | 102005029097 | 1/2007 |
| EP | 1275531 | 7/2002 |
| JP | 2003130749 | 5/2003 |

OTHER PUBLICATIONS

English Translation of claim 1 of DE20218044, Pub. date: Feb. 27, 2003.
Office Action for DE102007012335.5-52 dated Aug. 31, 2007.
Office Action for DE102007012335.5-52 dated Apr. 19, 2010.

* cited by examiner

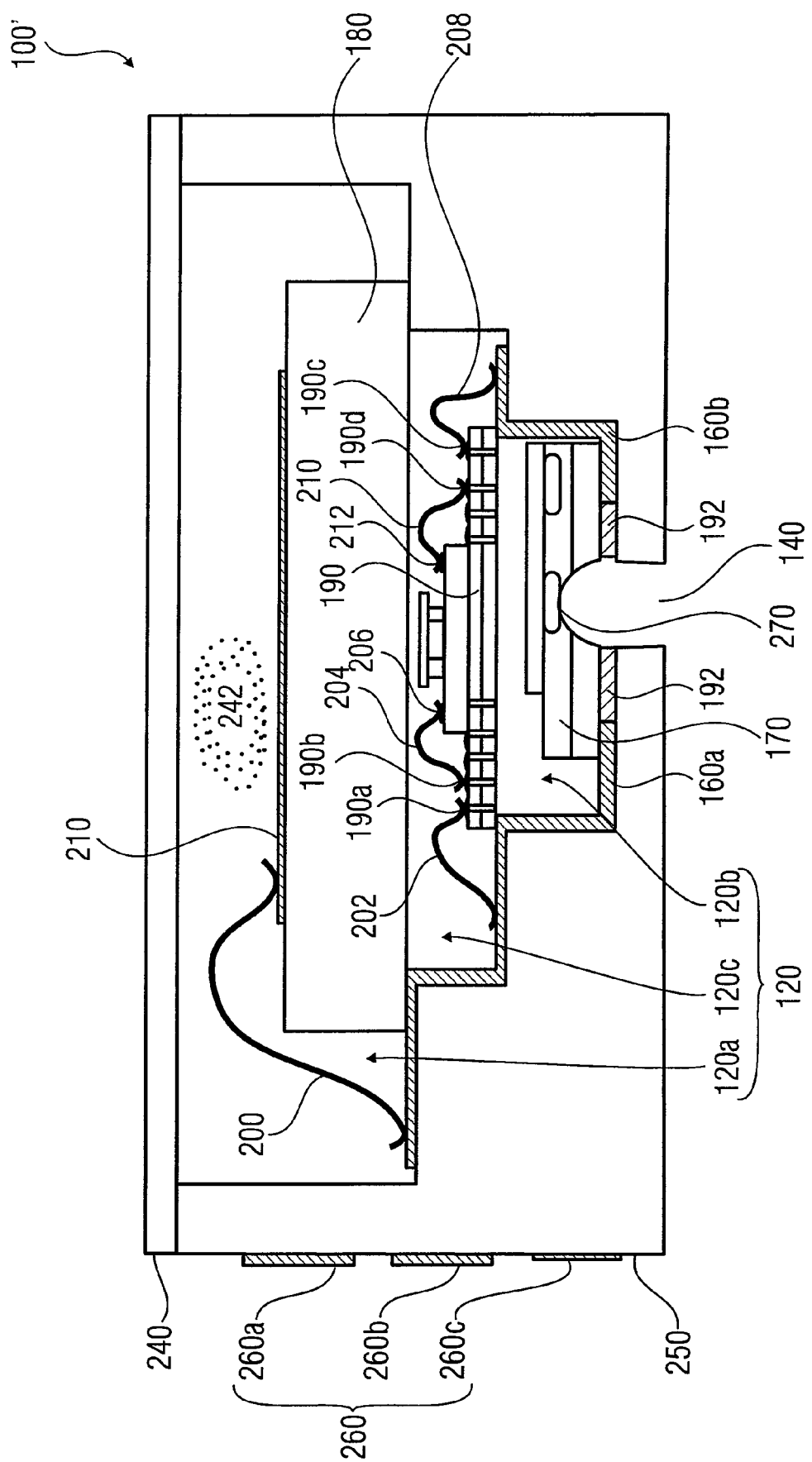

SENSOR COMPONENT AND METHOD FOR PRODUCING A SENSOR COMPONENT

CROSS-REFERENCE TO RELATED APPLICATIONS

This application claims priority from German Patent Application No. 102007012335.5, which was filed on Mar. 14, 2007, and is incorporated herein by reference in its entirety.

TECHNICAL FIELD

The invention relates to a sensor component and to a method for producing a sensor component.

BACKGROUND

By sensor knot is understood a combination of electronic components, which send through a transmitter or through several, eventually different sensors measured information wireless, e.g., by means of a high-frequency signal, to a receiver or to further sensor knots. An example of sensor knots are tire pressure sensors, which are arranged inside a tire, measure a tire pressure and send the sensor information wireless to the outside, thus to a receiver or also a further sensor outside the tire. Besides measuring the tire pressure, further signals such as rotation and/or temperature are in part also detected and processed. When several such sensor knots communicate with each other, it is called a sensor network.

SUMMARY

According to different embodiments, such as a device for detecting a measured quantity including a sensor chip for detecting the measured quantity, supply means for providing an energy supply, and an injection-molded enclosure for accommodating the sensor chip and the supply means, the injection-molded enclosure may have integrated conductive traces, which provide an electrical connection between the sensor chip and the supply means.

BRIEF DESCRIPTION OF THE DRAWINGS

Embodiments of the invention will now be described in more detail, with reference to the attached drawings, in which:

FIG. 2 is a cross-sectional view of an enclosure with several components arranged above each other, according to a further embodiment.

DETAILED DESCRIPTION

Figure 1A:
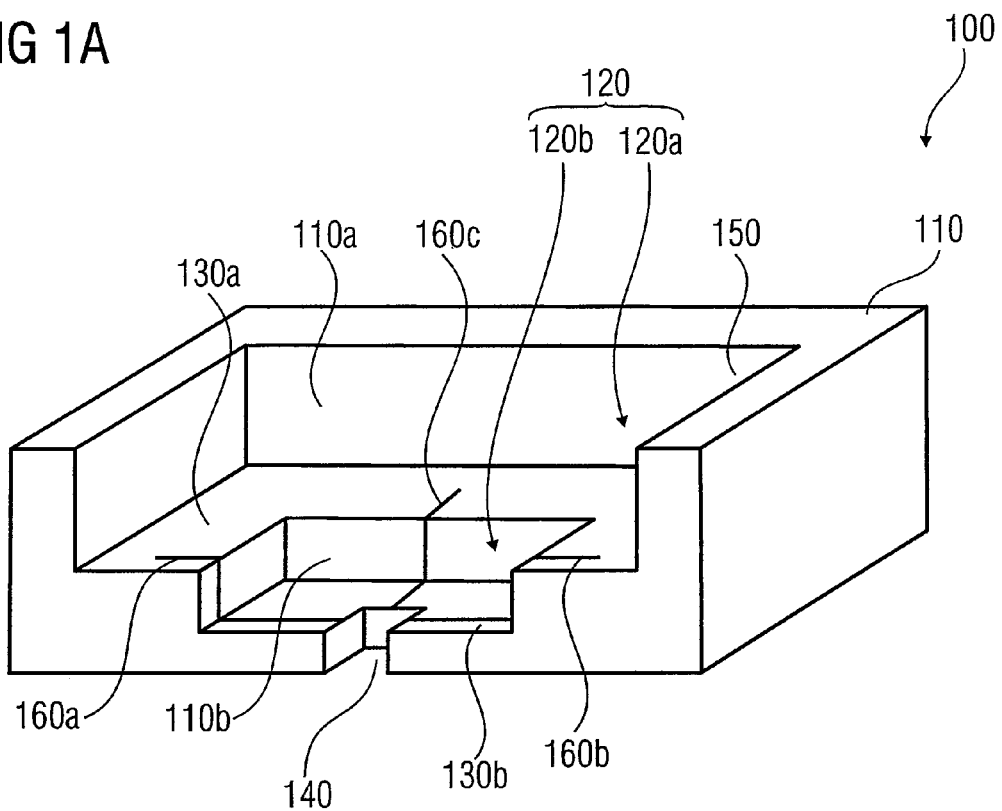
FIG. 1A is a cross-sectional view of an enclosure for accommodating sensor components according to an embodiment.

Before explaining hereafter embodiments in more detail, with reference to the drawings, the attention is drawn to the fact that identical or equivalent elements in the figures are designated by identical or similar reference numerals, and that a repeated description of these elements is omitted.

Conventional enclosures necessitate a cost-intensive production method and enable only a limited miniaturization possibility and only limited optimization possibilities for the overall design. In addition, very different assembly methods have an influence on the sensor chip, which usually reacts very sensitively to mechanical strains. Conventional solutions or conventional sensor knots are comprised of subcomponents that are fitted in sub-enclosures. An example is a combination of a sensor and a sensor ASIC in an enclosure. These sub-packages are mounted together with further components (inclusive battery and an antenna) on a printed circuit board (PCB) and recovered with plastic by injection-molding. The manufacture lines needed to this end result into a cost-intensive production process. Furthermore, the conventional solutions provide only a limited miniaturization possibility and only a limited optimization possibility for the overall design—in particular, three-dimensional arrangements or three-dimensional variants prove problematic. Finally, very different assembly processes have an influence on the sensor chip, e.g., several processes for recovering by injection-molding. Since the sensor chip can react sensitively to mechanical strains, the conventional process proves problematic or error-prone.

Furthermore, special requirements exist for sensor knots as regards the enclosure technique. The enclosure should contain a power-supply, which in the simplest case can be a battery or can also include an energy-harvesting or energy-scavenging system. The latter are energy-independent systems that generate the energy from the environment (e.g., from vibrations, temperature gradients or solar energy) or convert ambient energy into electrically usable energy. In the case of energy harvesting or energy scavenging, e.g., piezoelectric effects, inductive effects or also thermoelectric effects are used. In another variant, the necessary energy is irradiated from the outside by means of electromagnetic waves. As another requirement, there can be provided that the enclosure has an integration possibility for an RF antenna and is suited for a sensor, i.e. a signal to be measured reaches a sensor or a transmission chip. In the case of a pressure sensor, an opening to the active surface of the sensor chip can be provided, so that a pressure in the environment can be present at the sensor. Such a sensor knot can have various subcomponents, e.g., a sensor chip, a sensor ASIC (ASIC=user-specific integrated circuit), further chips that can include transmitters, receivers and/or transceivers, as well as resonators, passive components, etc. The enclosure can also enable re-wiring options, thus a possibility of interconnecting the sub-components or components in a conductive way. Finally, the size of the sensor knot cannot be increased unnecessarily by the enclosure, i.e. the enclosure can enable a three-dimensional compact construction.

Embodiments refer to a device for detecting a measured quantity, the device having sensor means or a sensor chip for detecting the measured quantity, supply means for providing energy supply and an injection-molded enclosure for accommodating the sensor chip and the supply means, the injection-molded enclosure having integrated conductive traces that provide an electrical connection between the sensor chip and the supply means. Further embodiments include, furthermore, means for wireless transmitting information, the means for wireless transmitting being also accommodated in the injection-molded enclosure. Embodiments include a method for producing a sensor component, an injection-molded enclosure with a cavity being provided in which are placed a sensor and a energy-supply element, so that the sensor and the energy-supply element can be protected by the plastic component.

In some embodiments, the injection-molded enclosure may be a plastic component, the injection-molded enclosure having at least a cavity in which the sensor chip and/or the supply means is arranged. A compact three-dimensional arrangement can be chosen, i.e. the sensor chip and the supply means can be arranged above each other. Thus, the device or the sensor knot may have a volume as small as possible. Furthermore, the supply means can include an energy generator that can generate electricity, e.g., from an environment or from the environmental conditions. The generation of energy can occur, e.g., from a mechanical movement (e.g., vibrations, rotations, etc.) or also occur by means of a power radiation. Further embodiments can include an energy receiver, e.g., an antenna. Furthermore, the means for wireless transmitting can include a receiver and/or a transmitter or also a transceiver, so that the sensor knot is capable of exchanging information with a base station or another sensor knot.

According to an embodiment, the injection-molded enclosure can be formed as a so-called MID enclosure (MID=Molded Interconnect Device), which is a three-dimensional plastic part with at least a cavity and integrated conductive traces. The supply means, which has, e.g., an energy-supply element, can be so designed that it serves at the same time as a cover for the cavity. This is possible, e.g., in that the energy-supply element has a battery and the battery represents at the same time the cover. In order to enable sending or receiving data or also power radiation, embodiments can furthermore include an antenna, whereby the antenna can be placed, e.g., on an outer wall of the plastic component (MID enclosure). Furthermore, the MID enclosure can be comprised of at least two components (e.g., through 2-component injection molding), where the two components can differ from each other as to their electromagnetic properties. For example, both components can differ as to their dielectric constant and/or as to the dissipation factor, whereby the antenna can be placed at a location on the MID enclosure at which the dielectric constant is higher.

According to an embodiment, the sensor knot or the sensor component can include a pressure sensor. In addition, further sensors can however also be integrated. Examples of further sensors are sensors for detecting an acceleration, a rotation, a speed, ambient parameters (e.g., temperature, humidity of the air), for an optical or acoustic detection. Several sensors can also be provided, e.g., a pressure sensor with one or several of the mentioned further sensors (there can, e.g., be foreseen to detect a pressure only when a rotation of the wheel is detected through a rotation sensor). Furthermore, the cavity of the MID enclosure can include a sealing compound that serves as a termination or as a protection for the components of the sensor component. This can include a protection against outside conditions such as humidity or quick temperature variations, but also the possibility of absorbing mechanical impacts. At the same time, the maintaining of the components in the enclosure can be increased by means of the sealing compound. The sealing compound can include a silicone gel.

Some embodiments can create a sensor knot in a so-called MID enclosure, which forms a three-dimensional plastic part as a starting point. This plastic part is structure metallized, i.e. metal structures (e.g., conductive traces) are applied or generated on the plastic, which serve for bonding the different components. Different technologies are known for this purpose. Examples are: 2-component injection molding (2c-molding) with subsequent galvanic or chemical (current-less) reinforcing of the conductive traces; deposition of a seed layer, which is subsequently also reinforced galvanically or chemically, or also laser direct structuring (LDS). The structured plastic part (MID) can then serve as three-dimensional substrate in which or on which are fitted the single chips or components. The structured plastic part (MID) can have a cavity, which can consequently be filled with a polymer (e.g., silicone gel). In the MID enclosure can be provided holes (openings), which allow a signal input possible for sensors (e.g., for pressure measurement). Furthermore, other metallic structures can also be applied, so that, e.g., antennas can be integrated, alternatively on the inner or the outer surfaces. In addition, according to an embodiment, MID parts can be formed so that they can be metallized on both sides (inner and outer side), and a through connection can be made through a metallized hole (via hole).

Some embodiments can provide an economical enclosure for the sensor knot, i.e. one single enclosure for all subcomponents, whereby several encased enclosures can be avoided. Furthermore, embodiments can provide a broad freedom of design through the three-dimensional substrate in the form of the MID enclosure. In addition, the option of a reduced-tension chip mounting in the pre-injected cavity sealed exclusively by means of soft polymer for sensor chips can be advantageous. Under circumstances, sealing can be omitted, provided that applying a cover is sufficient for the necessary reliability. Finally, embodiments can provide an elegant integration possibility for the antenna and the power supply of the sensor knot.

Furthermore, according to an embodiment, due to the reduced power consumption of sensor knots, evacuation of heat or cooling down can be omitted. This is also a reason why the MID enclosure is suitable for this application. In the event it would be necessary in some embodiments to evacuate heat, heat spreaders or a heat sink can be integrated. This can occur, e.g., by means of an appropriate metal part that is injected into the MID enclosure. For example, a metal plate can be applied on a heat-developing chip or be brought into direct contact.

Some embodiments describe a sensor knot element integrated in a MID enclosure, the element including, e.g., a MID part, a sensor (e.g., a sensor chip), a transceiver (or transmitter and receiver), an antenna and a power supply that can also be implemented as an energy-harvesting system. The MID enclosure can also be designed for special target applications, e.g., sensor knots for tire pressure systems (TPMS=Tire Pressure Monitoring System).

According to an embodiment, a method for producing the sensor component can include the following manufacture steps. First, the injection-molded enclosure is manufactured, e.g., by means of an injection-molding single-component or multi-component method. Then are applied metal structures, which can include, e.g., conductive traces or large-surface metallizations. This can occur by means of the above-described method or also through structuring by means of photolithographic processes or laser coating and include, furthermore, the formation of the antenna. Next, subcomponents are provided, such as, e.g., semiconductor chips, passive components, other sensor chips, further already enclosed subcomponents, antennas or also, if such is foreseen in the embodiment to be equipped, a component that includes a power supply. Fitting of the subcomponents can occur, e.g., through gluing, soldering or thermo-compression. Provided such is foreseen, further electrical connecting procedures can be implemented, e.g., wire bonding, through which the subcomponents are electroconductively connected to the conductive traces of the injection-molded enclosure. The subcomponents can thus directly be electrically connected to each other. Finally, a termination in the form of a capsulation is carried out. This can occur, e.g., through bonding of a cover or through sealing with a polymer using both methods.

FIG. 1A shows a cross-sectional view of an enclosure 100 for accommodating sensor components according to an embodiment. The enclosure 100 is a MID enclosure, which is structured so as to include a cavity 120 limited by sidewalls 110, which includes an upper cavity 120a and a lower cavity 120b. The upper cavity 120a includes the sidewalls 110a and the upper bottom 130a. In the upper bottom 130a is arranged the lower cavity 120b, which is limited by sidewalls 110b and includes a lower bottom 130b. In the lower bottom 130b is formed an opening 140. Furthermore, the MID enclosure 100 includes an upper opening 150. In FIG. 1A are shown, furthermore, three conductive traces 160a, 160b and 160c, which extend, each, from the lower bottom 130b, via the sidewalls 110b of the lower cavity 120b, to the upper bottom 130a of the upper cavity 120a.

The enclosure 100 shown in FIG. 1A can be obtained through an injection molding process using a modified plastic, which can include, depending on the desired use of the enclosure, a laser-activatable plastic, e.g., as circuit substrate, a magnetic plastic, conductive polymers and/or an optical plastic, e.g., a polymeric optical wave-guide. The injection molding can allow a high geometrical shaping freedom and fine structures, e.g., <100 μm. Next, a laser structuring process can be carried out, while the metallization areas of the enclosure are germ-coated and roughened (writing of conductive traces). The laser structuring can allow flexibility in the event of changes of the circuit layout and can be performed with low tool expenses, whereby the layout can be tool-independent. After the laser structuring, a metallization of the germ-coated areas is performed, e.g., by means of a chemically reductive process or a chemical deposit of metal for the conductive trace.

Figure 1B:
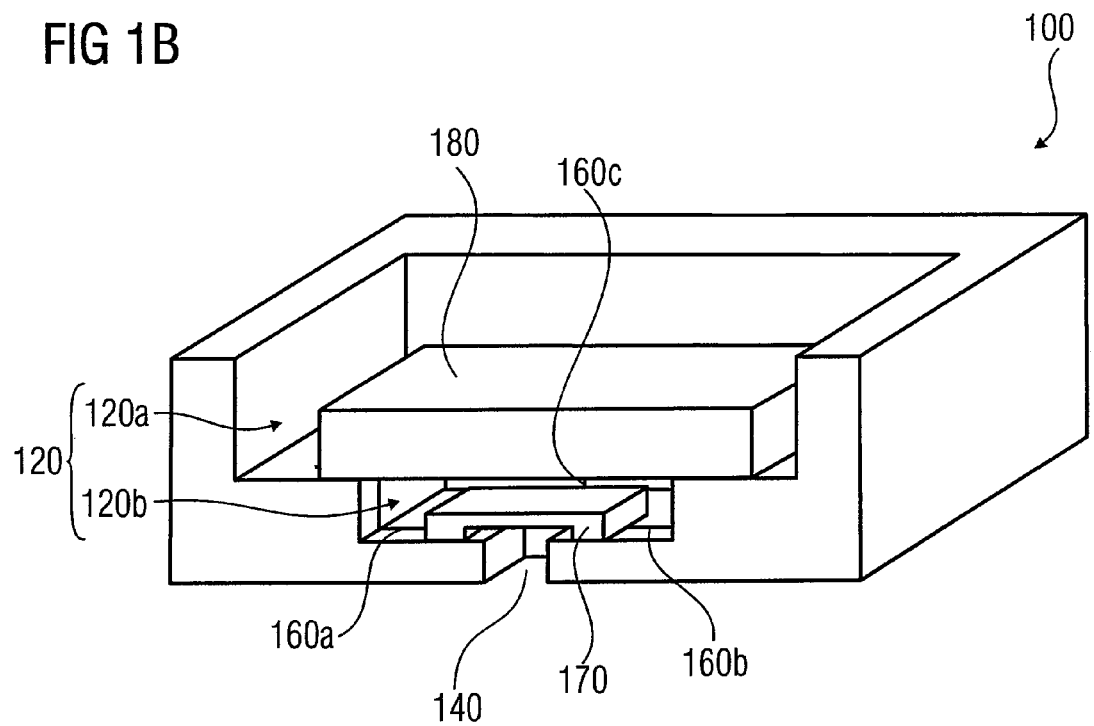
FIG. 1B is a cross-sectional view of the enclosure of FIG. 1A with a pressure sensor arranged therein and a energy-supply arranged therein according to a embodiment.

FIG. 1B shows a cross-sectional view of the enclosure 100 of FIG. 1A with a sensor chip 170 arranged therein and a energy-supply element 180 arranged therein according to an embodiment. The sensor chip 170 is arranged in the lower cavity 120b above the opening 140. The energy-supply element 180 is arranged in the first cavity 120a. The opening 140 enables access to a measured quantity (e.g., a pressure), which is detected by the sensor chip 170. The sensor chip 170 can be a pressure sensor, whereby the opening 140 can, in this case, be a simple hole in the injection-molded enclosure 100. The sensor chip 170 is electrically connected to the conductive traces 160a to 160c shown in FIG. 1A, e.g., by means of solder connections or the like. Likewise, the energy-supply element 180 is electrically connected to the conductive traces 160a and 160b shown in FIG. 1A, so that the sensor chip 170 can receive via the lines 160a and 160b the electrical energy necessary for its operation. The conductive trace 160c can be provided for outputting a measuring signal from the sensor chip 170, e.g., to a processing circuit not shown in FIG. 1B.

The function of the MID enclosure 100 can be a multiple one: (a) as an enclosure, it can maintain the sensor chip 170 and the energy-supply element 180 in a fixed position with respect to each other; (b) as an enclosure, it can protect the sensor chip 170 and the energy-supply element 180 against external influences, e.g., contamination, etc.; (c) as a part of an outer wall of a cavity, it can be part of a gas-tight cavity with a predetermined gas pressure; and/or (d) as a support for the conductive traces 160a, 160b, 160c, it can serve for electrically bonding the sensor chip 170 to the energy-supply element 180. The multi-functionality of the MID enclosure 100 can ensure that through mounting the sensor chip 170 and through mounting the energy-supply element 180 in the MID enclosure 100 is created a cavity protected against the environmental conditions and, at the same time, an electrical connection between the sensor chip 170 and the energy-supply element 180.

FIG. 2 shows an embodiment in which an enclosure 100' has three cavities, the upper cavity 120a, the lower cavity 120b and a central cavity 120c. In the lower cavity 120b is arranged the sensor chip 170, in the central cavity 120c is arranged a further subcomponent 190, and in the upper cavity 120a is arranged the power-supply element 180. The injection-molded enclosure 100' includes the opening 140 up, in order to allow a measured quantity to have access to the sensor chip 170. Between the sensor chip 170 and the enclosure, a sealing material 192 can be provided around the opening, e.g., in order to guarantee, when detecting an external pressure, that only the external pressure is present at the sensor chip 170. In addition, the cavity has the structured metallization, the conductive traces 160a and 160b. The conductive trace 160a extends from the lower cavity 120c via the central cavity 120c, to the upper cavity 120a. The conductive trace 160b extends from the lower cavity 120c only to the central cavity 120c. A wire bond 200 connects the section of the conductive trace 106a formed in the upper cavity 120a to a contact 201 of the energy-supply element 180. The subcomponent 190 includes several contacts 190a, 190b, 190c and 190d. The contact 190a is connected through a bonding wire 202 with the section of the conductive trace 106a formed in the central cavity 120c. The contact 190b is connected through a bonding wire 204 to a connection 206. The contact 190c is connected through a bonding wire 208 to the section of the conductive trace 106b formed in the central cavity 120c. The contact 190d is connected through a bonding wire 210 to a further connection 212. The sensor chip 170 is also connected to the conductive traces 160a and 160b. Furthermore, a sealing compound 242 can totally or partly fill the cavity 120 and, optionally, a cover 240 can close the upper opening 150. On a side face 250 of the injection-molded enclosure 100' can be placed an antenna structure 260 that can include one or more components 260a, 260b, 260c. The subcomponent 190 can have several parts or various electrical elements. For example, semiconductor chips, resonators or also passive components can form a part of subcomponent 190 (e.g., transceiver systems or a transmission/receiving unit, evaluation chips for the sensor signals, etc.). The antenna structure 260 can be bonded, e.g., by means of the opening 140, but also by means of a further opening or a through-connection (not shown in FIG. 2). It would also possible to provide a further metallization from the outside, i.e. along an outer wall of the enclosure 100', to the side face 250.

The sensor chip 170 can be a sensor for measuring a pressure, an active sensor surface 270, e.g., a membrane area, being in this case arranged above the opening 140 of the injection-molded enclosure 100'. The injection-molded enclosure 100' can be formed as a MID enclosure. The sensor chip 170 can also have further sensors, which can include, e.g., a movement sensor or a rotation sensor or a temperature sensor. Further possibilities for the sensor or sensor chip include a sensor with movable parts, e.g., MEMS structures (MEMS=mirco-electro-mechanical system) with or without a membrane or also sensors with fixed elements, e.g., an ISFET (ion sensitive field effect transistor) or generally fluid sensors.

The energy-supply element 180 can be a battery, which guarantees a power supply. A power supply can however also include energy generation, eventually in addition to the battery, e.g., by means of a power radiation. In this case, the energy-supply element 180 can have appropriate receiving means (e.g., a further antenna). Energy generation can also include using vibration energy or rotation energy or also using the ambient temperature. The subcomponent 190 can include a user-specific circuit for the sensor chip 170 (sensor ASIC) or high-frequency parts (RF parts) or resonators. The subcomponent 190 can, e.g., perform control, regulation or evaluation functions for the sensor chip 170. The structured metallizations 160a to 160c can be applied on an inner surface of the MID enclosure 100', whereby the structured metallizations can have conductive traces 160a to 160c and chip pads. Instead of the wire bonds, flip chip connections can also be provided. The sealing compound and the cover are optional parts of the sensor component and can be provided for a better protection of the components (of the sensor chip 170, the energy-supply element 180, the subcomponent 190, etc.), e.g., against humidity, vibrations and also for isolation. The sealing compound can include a silicone gel or another polymer. The antenna can be a structured metallization on the plastic component or the MID enclosure 100'. The antenna can serve for transmitting sensor data to a base station or to other sensor knots (not shown) or for receiving control information from the base station. The antenna can, eventually at the same time, serve for a power input or for receiving a power radiation (as known, e.g., from RFID chips). In order to enable transmitting and receiving information, the subcomponent can include, e.g., a transmitter, a receiver or a transceiver, which is connected to the antenna.

In further embodiments, individual components can also be mounted outside, e.g., on the lower face or a side face of the enclosure 100 or 100'. It is also possible for individual components to be formed with a vertical shape, thus not with a planar shape (with respect to the cover 240). This can occur inside or outside the MID enclosure. The battery can be used as a cover 240. Furthermore, the cover 240 can serve as a wiring substrate, and one or several further subcomponents can be mounted on the cover 240. The cover can be metallized on both sides and have through-connections.

The injection-molded enclosure can be produced by means of a two-component injection molding (2c-molding) or a multi-component injection molding. The finished injection-molded enclosure can have at least two materials, which are different, e.g., as regards their electromagnetic properties, e.g., the dielectric constant or the dissipation, and are chosen so that the high-frequency properties (RF), e.g., sending and receiving properties, of the total system are optimized. An example is a "high-epsilon" material (i.e. with high dielectric constants) as a substrate or base for the antenna 260 or the antenna structure. Increasing the dielectric constant can enable a reduction of the antenna structure (at the same frequency).

The sensor can include a semiconductor sensor and be formed as a MEMS structure with movable parts. The sensor or sensor chip can be applied against a wall of the injection-molded enclosure. Likewise, the supply means can be arranged on a wall of the injection-molded enclosure.

The opening in the injection-molded enclosure can be provided when an external measured quantity should be applied directly on the sensor. When this is not necessary, e.g., in the case of an acceleration sensor, the opening 140 can be omitted. Furthermore, a membrane that closes the opening 140 can be provided as a protection, provided that the membrane is so formed that e.g., a pressure transmission between the inner and the outer space is possible. The opening can be protected by a glass cover, provided that a radiation should be detected.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A device for detecting a measured quantity, comprising:
   a sensor chip for detecting the measured quantity;
   a supply means for providing an energy supply; and
   an injection-molded enclosure for accommodating the sensor chip and the supply means, the injection-molded enclosure comprising integrated conductive traces that provide an electrical connection between the sensor chip and the supply means,
   wherein the injection-molded enclosure includes at least two components that differ from each other as to at least one of the following by at least 50%: their dielectric constant and their dissipation factor.

2. The device according to claim 1, including furthermore means for wirelessly transmitting information.

3. The device according to claim 1, wherein the injection-molded enclosure comprises at least one cavity in which at least one of the sensor chip and the supply means are arranged.

4. The device according to claim 1, wherein the sensor chip and the supply means are arranged above each other.

5. The device according to claim 1, wherein the supply means includes an energy generator, in order to generate electric energy from an environment.

6. The device according to claim 5, wherein the energy generation occurs by using a movement or through power radiation.

7. A device for detecting a measured quantity, comprising:
   a sensor chip for detecting the measured quantity;
   a means for wirelessly transmitting information; and
   an injection-molded enclosure for accommodating the sensor chip and the means for wirelessly transmitting, the injection-molded enclosure including integrated conductive traces that enable an electrical connection between the sensor chip and the means for wirelessly transmitting,
   wherein the injection-molded enclosure includes at least two components that differ from each other as to at least one of the following by at least 50%: their dielectric constant and their dissipation factor.

8. The device according to claim 7, comprising furthermore supply means for providing an energy supply.

9. A sensor component, comprising:
   a sensor chip;
   an energy-supply element; and
   an injection-molded enclosure, which contains the sensor chip and the energy-supply element, the injection-molded enclosure including integrated conductive traces that enable an electrical connection between the sensor chip and the energy-supply element,
   wherein the injection-molded enclosure includes at least two components that differ from each other as to at least one of the following by at least 50%: their dielectric constant and their dissipation factor.

10. The sensor component according to claim 9, including furthermore a transmitter.

11. The sensor component according to claim 9, including furthermore at least one of a receiver and a transceiver.

12. The sensor component according to claim 9, wherein the injection-molded enclosure comprises at least one cavity in which at least one of the sensor chip and the energy-supply element is arranged.

13. The sensor component according to claim 12, wherein the at least one cavity is at least partially filled with a sealing compound.

14. The sensor component according to claim 12, wherein the at least one cavity is covered with a cover.

15. The sensor component according to claim 14, wherein the cover includes the energy-supply element or the cover includes a further energy-supply element.

16. The sensor component according to claim 9, comprising furthermore an antenna that is applied on an outer face of the injection-molded enclosure.

17. The sensor component according to claim 9, wherein the sensor chip includes a pressure sensor.

18. A sensor component, comprising:
   a pressure sensor;
   an energy-supply element;
   a transmitter;
   an antenna; and
   an injection-molded enclosure with an opening and a cover, the opening connecting an inner space of the injection-molded enclosure to an environment, the pressure sensor being arranged in the inner space, above the opening, and the energy-supply element and the transmitter being arranged in the inner space,
   wherein the injection-molded enclosure includes at least two components that differ from each other as to at least one of the following by at least 50%: their dielectric constant and their dissipation factor.

19. The sensor component according to claim 18, wherein the injection-molded enclosure includes integrated conductive traces.

20. The sensor component according to claim 19, comprising furthermore wire bonds for connecting the energy-supply element, the transmitter and the pressure sensor through the wire bonds and the integrated conductive traces.

21. The sensor component according to claim 18, wherein the cover includes a battery.

22. The sensor component according to claim 18, comprising furthermore a thermal conductor.

23. The sensor component according to claim 18, comprising furthermore a further sensor.

24. The sensor component according to claim 23, wherein the further sensor is an acceleration sensor.

25. The sensor component according to claim 18, comprising furthermore an evaluation circuit.

26. A method for producing a sensor component, comprising:
   providing an injection-molded enclosure with a cavity and integrated conductive traces;
   introducing a sensor chip into the cavity;
   introducing an energy-supply element into the cavity; and
   electrically connecting the sensor chip and the energy-supply element to the integrated conductive traces,
   wherein the injection-molded enclosure includes at least two components that differ from each other as to at least one of the following by at least 50%: their dielectric constant and their dissipation factor.

27. The method according to claim 26, wherein the integrated conductive traces are generated through structuring a layer of conductive traces.

28. The method according to claim 27, wherein the structuring includes a photolithographic process.

29. The method according to claim 26, comprising furthermore introducing a sealing compound into the cavity.

30. The method according to claim 29, wherein the sealing compound includes a silicone gel.

31. A method for producing a sensor component, comprising:
   providing an injection-molded enclosure with a cavity and an opening;
   arranging a pressure sensor in the cavity, above the opening;
   arranging a transceiver in the cavity;
   arranging a supply in the cavity; and
   arranging an antenna on a side face of the injection-molded enclosure,
   wherein the injection-molded enclosure includes at least two components that differ from each other as to at least one of the following by at least 50%: their dielectric constant and their dissipation factor.

32. The method according to claim 31, comprising furthermore introducing a sealing compound.

33. The method according to claim 31, comprising furthermore applying a cover, so that the cavity is separated from the environment by the cover.

34. The method according to claim 33, wherein the cover is used as a wiring carrier.

35. The method according to claim 31, comprising furthermore the provision of an energy generator, the energy generator being capable of generating electric energy from a power radiation.

* * * * *